United States Patent [19]

Hwang et al.

[11] Patent Number: 4,945,303
[45] Date of Patent: Jul. 31, 1990

[54] FREQUENCY DETECTOR

[75] Inventors: Chiang-Tung Hwang, Keelung; Ray-Shun Chou, Taipei, both of Taiwan

[73] Assignee: Acer Incorporated, Taipei, Taiwan

[21] Appl. No.: 316,360

[22] Filed: Feb. 27, 1989

[51] Int. Cl.$^5$ ............................................. G01R 33/20
[52] U.S. Cl. ............................ 324/78 D; 324/79 D; 328/140
[58] Field of Search ............... 324/77 R, 78 D, 78 R, 324/79 R, 83 R, 83 D; 377/31; 328/140

[56] References Cited

U.S. PATENT DOCUMENTS

| | | | |
|---|---|---|---|
| 3,887,870 | 6/1975 | Grosseau | 324/78 D |
| 4,097,798 | 6/1978 | Olson | 324/78 D |
| 4,144,490 | 3/1979 | Stevens | 324/78 D |
| 4,257,003 | 3/1981 | Yool | 324/78 D |
| 4,456,876 | 6/1984 | Haymaker | 324/77 R |
| 4,580,281 | 4/1986 | Carlton | 377/31 |
| 4,616,173 | 10/1986 | Cook et al. | 324/78 D |
| 4,675,597 | 6/1987 | Hetnandez | 324/78 D |
| 4,745,356 | 5/1988 | Henze | 324/78 D |
| 4,786,861 | 11/1988 | Hulsing | 324/78 D |

Primary Examiner—Michael J. Tokar
Attorney, Agent, or Firm—Townsend and Townsend

[57] ABSTRACT

A frequency detection device and associated method are disclosed. The frequency detection device divides a time base into a plurality of discrete time bases. Clock pulses are added during the discrete time bases in order to determine the frequency of the clock signal. A method and associated apparatus for reducing round-off error partial in displays are also disclosed. Round-off error is reduced by assigning a value of "5" to a more significant digit which is not to be displayed.

8 Claims, 5 Drawing Sheets

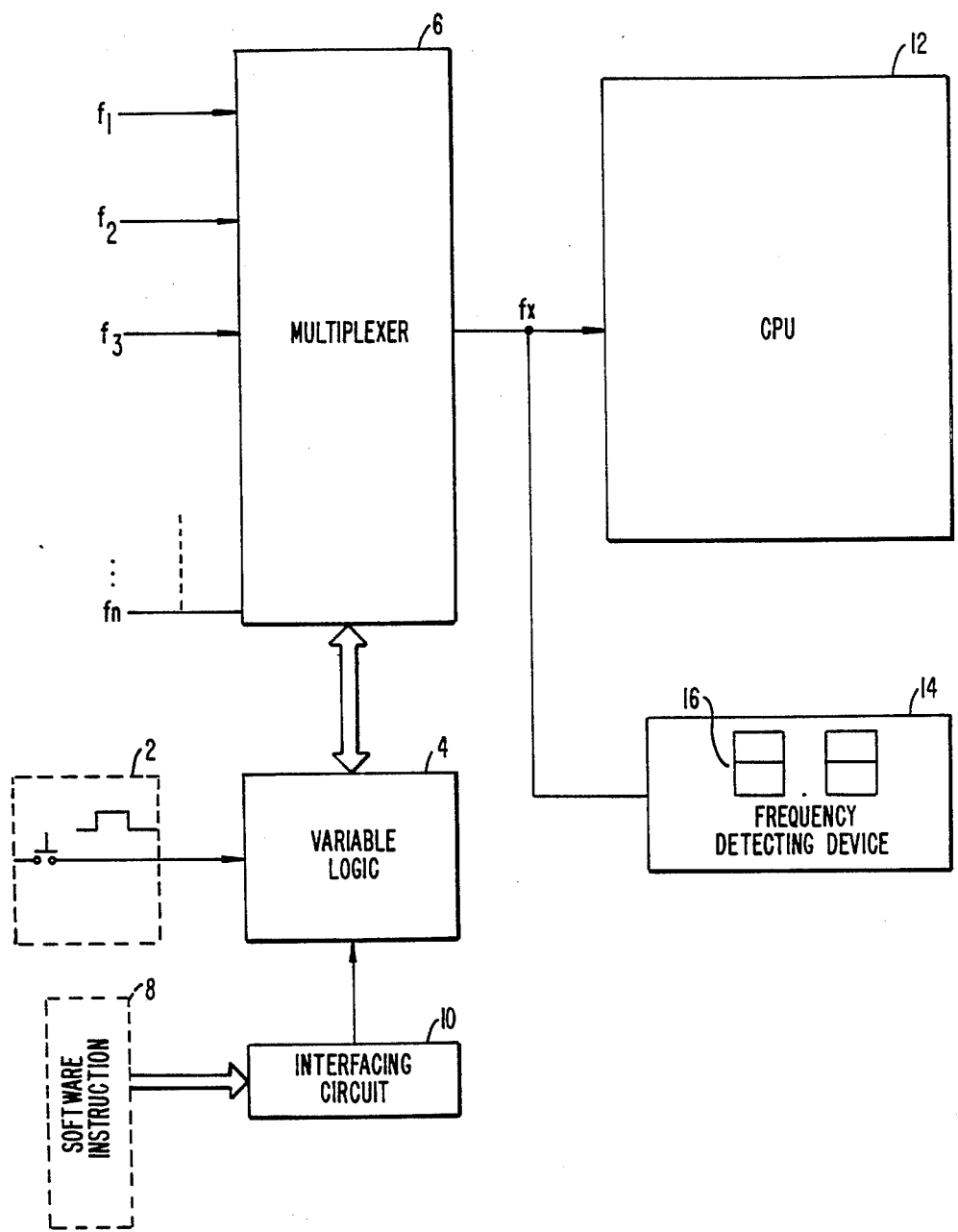
FIG._1. PRIOR ART

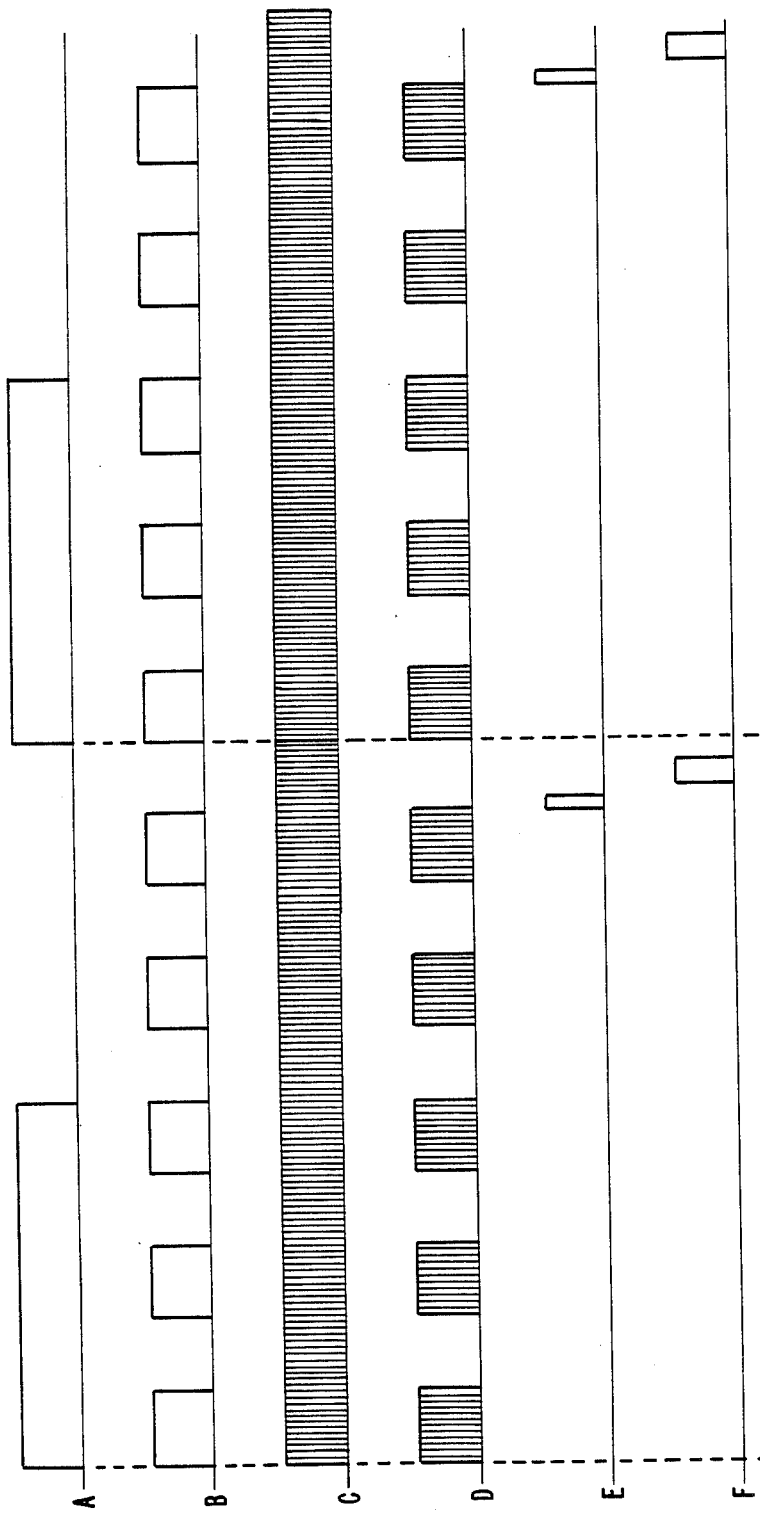
FIG._2.

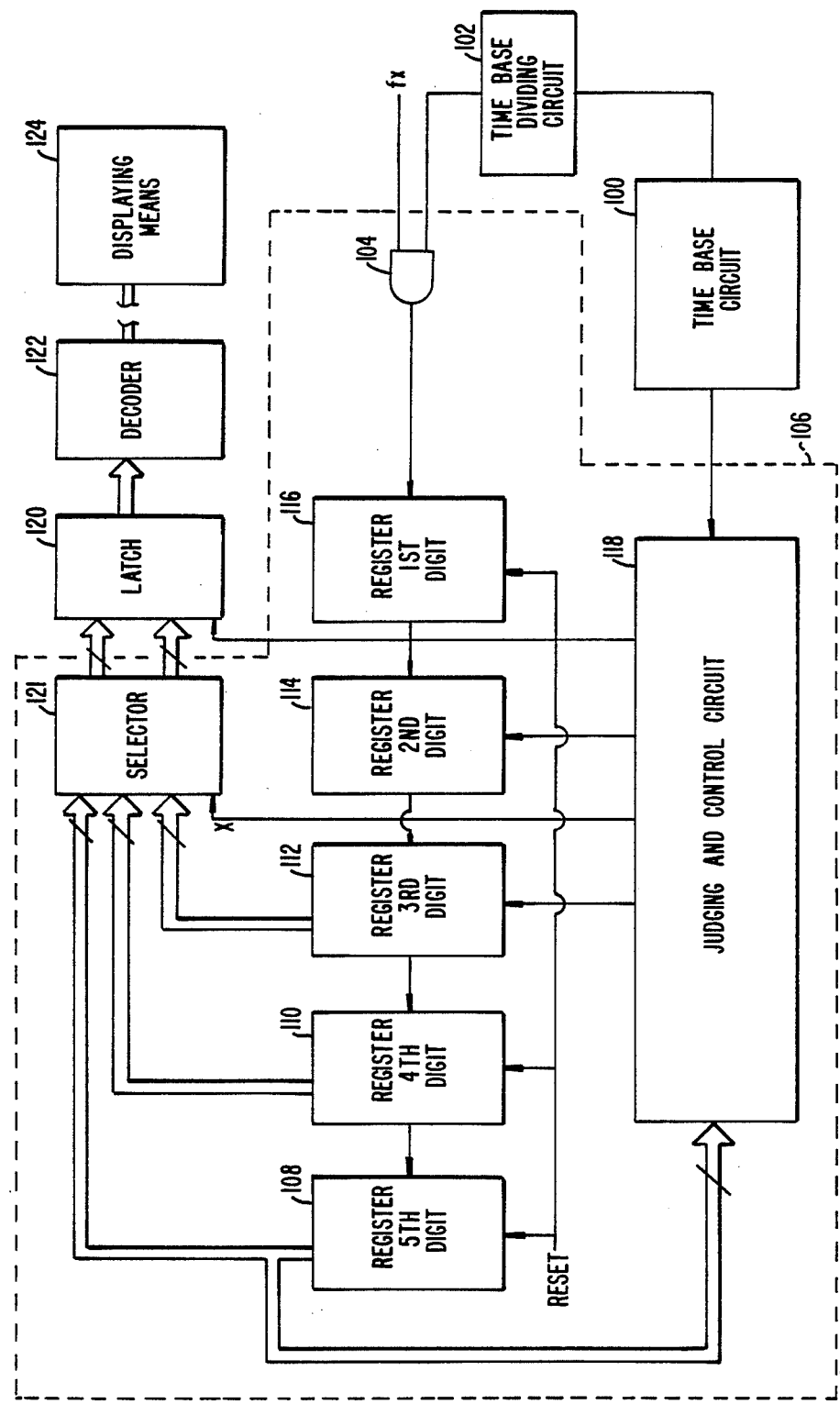
FIG._3.

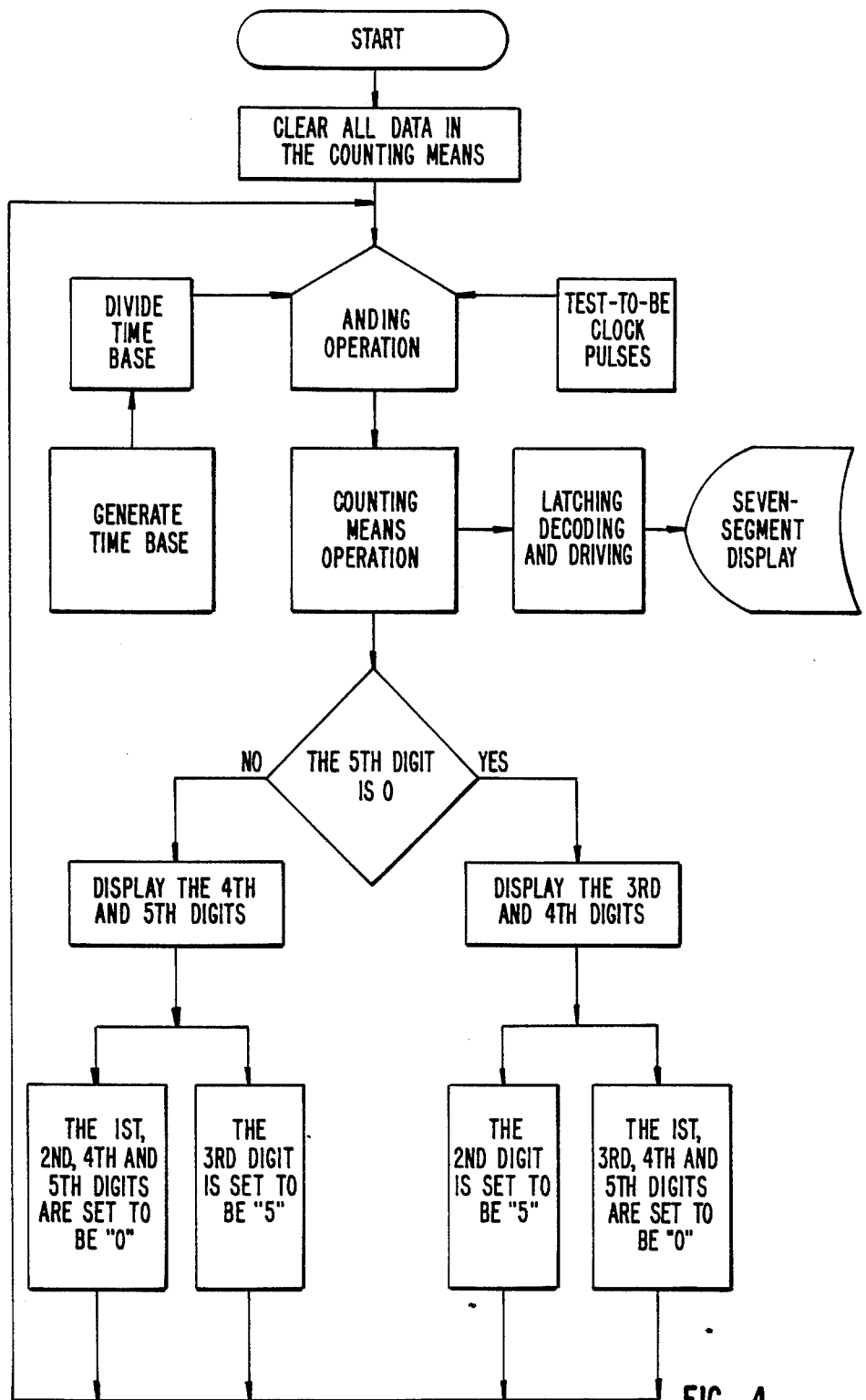
FIG._4.

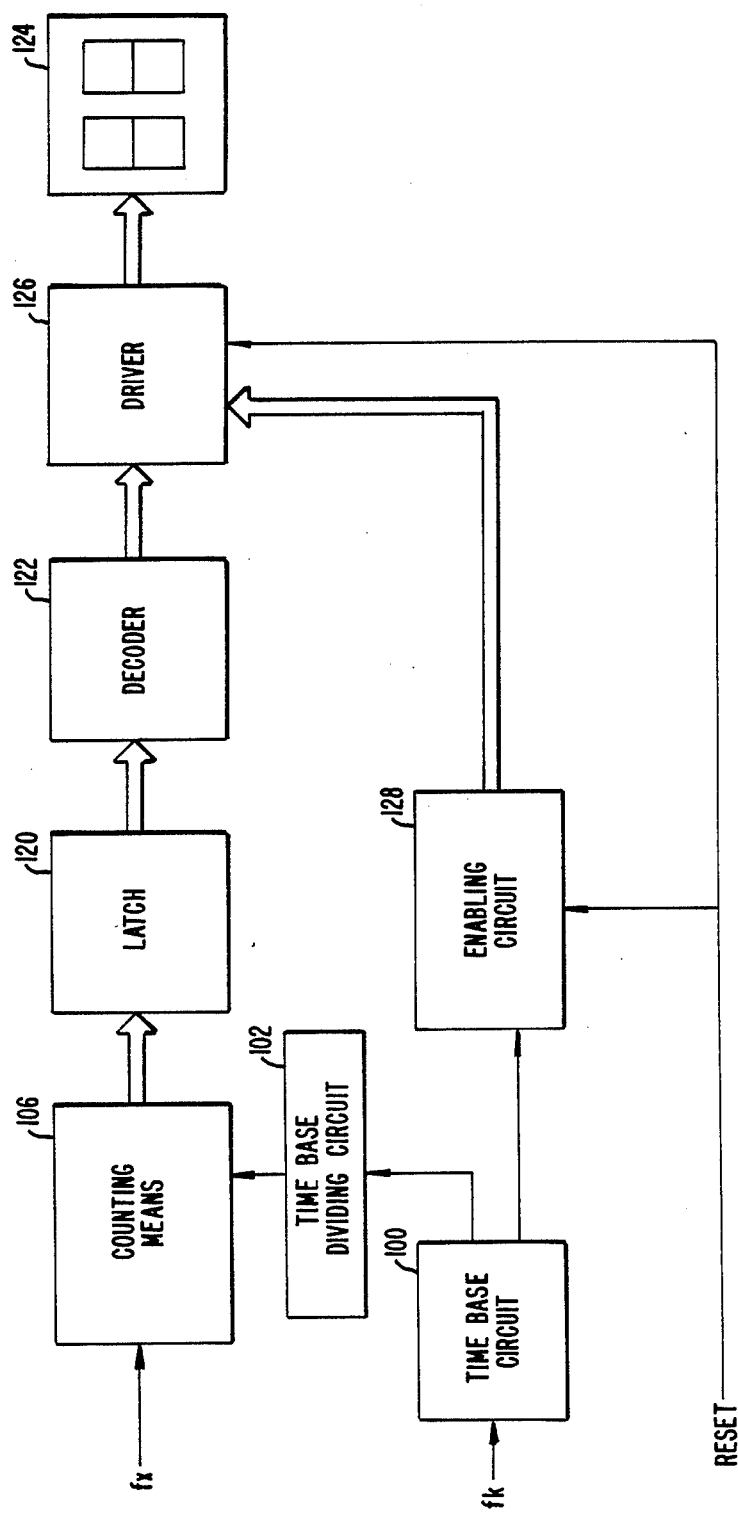
FIG._5.

FREQUENCY DETECTOR

BACKGROUND OF THE INVENTION

1. Field of the Invention

The present invention relates to the field of signal frequency measurement. More particularly, the present invention provides a method and apparatus for measurement of the frequency of clock pulses which are utilized in a central processing unit (CPU) of a microcomputer or the like.

2. Description of Related Art

FIG. 1 generally indicates the prior art method and associated apparatus which have been used in conjunction with clock pulse frequency measurement systems in a microcomputer system. A monostable switch 2 is used to control a variable logic device 4. The output from variable logic device 4 is used to select one of a plurality of clock pulses with frequencies f1, f2, f3, ... fn which are input into multiplexer 6. Alternatively, the variable logic from variable logic device 4 can be set with a software instruction 8 via an interfacing circuit 10. Output fx from multiplexer 6 is sent to both a CPU 12 and a frequency detecting device 14. Frequency detecting device 14 may be provided with a display 16.

In prior art systems the frequency fx and, therefore, the indicated frequency from frequency measurement device 14 often drifts over a period of time due to variations of temperature, material properties, noise interference, and the like. Additionally, in many systems only the two most significant digits of frequency are displayed and the rest of the digits are ignored by the device. As a consequence, the indicated frequency may contain significant, non-trivial error, especially when the third, undisplayed digit is equal to or greater than 5.

A timing diagram for prior art systems is provided in FIG. 2 and compared to the invention described herein. The frequency of a series of clock pulses, shown on coordinate C, is to be measured. In the prior art, a time base shown on coordinate A would be utilized. The frequency counter counts the number of clock pulses occurring in the time base and the result is displayed as the frequency of the clock pulses. For example, if the time base is 1 πs and 10 pulses are counted in the time base, the frequency of the clock pulses is 10 MhZ. It is often observed, however, that the frequency of signal C drifts. Therefore, the indicated frequency tends to be unstable. This instability may result from temperature variations, noise, and the like.

Patents related to the field of frequency measurement include Carlton, U.S. Pat. No. 4,580,281; Cook et al., U.S. Pat. No. 4,616,173; Yool, U.S. Pat. No. 4,257,003; and Haymaker, U.S. Pat. No. 4,456,876.

SUMMARY OF THE INVENTION

A frequency measurement method and apparatus is disclosed. The method and apparatus are more stable than those used in the prior art and reduce round-off error.

The frequency counter is provided with a time base. The time base is divided into a plurality of discrete time bases, permitting clock pulses to be sampled and counted during several discrete sub-time bases over a wider range of time. The number of clock pulses counted during the sub-time bases is added, resulting in a displayed frequency value which is very stable. An accumulated counting value based on this "spread" time base is more stable and more accurate and avoids indicated frequency drift caused by variations in temperature, noise, and the like in the circuitry.

Round-off error is also reduced by the method and apparatus described herein, especially when only the most significant digits are displayed in the frequency measurement operation. This is accomplished by assigning a "5" to a next most significant digit and a "0" to all other digits, permitting automatic round-off after the first counting operation.

BRIEF DESCRIPTION OF THE FIGURES

FIG. 1 illustrates a prior art system for frequency measurement.

FIG. 2 illustrates a timing diagram for prior art systems and for the method and apparatus disclosed herein.

FIG. 3 illustrates the frequency measurement apparatus disclosed herein.

FIG. 4 is a flow chart showing the frequency measurement method and the round-off error correction method disclosed herein.

FIG. 5 illustrates the frequency counter in more detail.

DETAILED DESCRIPTION OF THE PREFERRED EMBODIMENTS

FIG. 3 illustrates the apparatus disclosed herein. The apparatus is used to determine the frequency of a series of clock pulses, shown on coordinate C in FIG. 2.

A time base circuit 100 is used to provide a time base to time base dividing circuit 102. The output of the time base dividing circuit is a series of sub-time bases and is provided to the input of AND gate 104 in counter 106. The sub-time bases are illustrated by coordinate B in FIG. 2. As an example herein, the time base has been divided into 5 sub-time bases. As shown in FIG. 2, the divided time base covers a wider range of time as compared to the un-divided time base.

The output of AND gate 104 is attached to a Binary-Coded Decimal (BCD) counter comprising five registers (108, 110, 112, 114, and 116) with register 108 representing the fifth digit. In the example provided herein, the fifth digit is the most significant digit, but it is to be understood that the invention described herein could be utilized with a device utilizing any number of digits and in a device in which any digit is the most significant digit. Register 110 represents the fourth digit, register 112 the third digit, register 114 the second digit, and register 116 the first digit. In the example provided herein, the first digit is the least significant digit.

Clock pulses during each sub-time base are successively counted in the BCD counter until the total sum of the sub-time bases is equal to or approximately equal to the original time base. The judging and control circuit 118 (which may, for example, be an EPROM of the type known to those of skill in the art) then sends a latch signal "x" (indicated by coordinate E in FIG. 2) to selector 121 which determines if the fourth and fifth digits or the third and fourth digits are to be displayed, using logic discussed below. The output of selector 121 is transmitted to a latch 120 and then to decoder 122 and thereafter to display means 124 which may be, for example, two seven-segment displays and a decimal point. Thereafter, a reset pulse (illustrated by coordinate F in FIG. 2) is applied to selected registers in the counter to restart the process. The frequency counted in the counter represents an average frequency over a substantially wider range of clock pulses as compared to the prior art.

Operation of the invention is further illustrated with the flow chart shown in FIG. 4. After initiating the process, all data contained in the counting means are cleared. As shown in the top portion of FIG. 4, the time base is first generated, and divided. The divided time base and the clock pulses are then AND'ed, counted, decoded, and displayed.

The remaining portion of FIG. 4 illustrates the round-off operation provided herein. Often, frequency detectors display only a few of the most significant digits (e.g., two digits). In the example illustrated herein, the fifth digit is the most significant digit and only 2 digits of a total of 5 digits are to be displayed. In order to provide proper round-off, it is first determined if the fifth digit is a "0". If the fifth digit is a "0", then the third and fourth digits are displayed in the seven segment display. Thereafter, the second digit is set to be "5" and other digits are cleared to be "0". Therefore, in the second operation cycle, i.e., the second time base, and all cycles thereafter, the two displayed digits will be automatically rounded. Likewise, if the most significant digit is not a "0" the fourth and fifth digits are displayed and, thereafter, the third digit is set to be a "5" and the remaining digits are cleared to be "0". In general, the most significant digit which is not displayed is set to a value of "5" and all other digits are set to be "0".

It should be recognized that the invention has been illustrated with reference to an embodiment in which a value of "5" has been assigned to the most significant digit not to be displayed, but other values could be assigned without departing from the spirit of the invention. For example, even if a value of "1" was assigned to the most significant digit not to be displayed, round-off error would be reduced as compared to prior art systems. Any non-zero value of preferably about 5 could be utilized.

As an example, suppose the registers contain the digits "1 2 3 4 5" based on the first counting operation. Since the fifth digit is not a zero the fourth and fifth digits (i.e., "1 2") are displayed. A "5" is set in the third digit and the rest of the digits are cleared. In the second loop, if the counting operation remains constant, the registers will contain "1 2 8 4 5" and, again, "1 2" will be displayed. Hence appropriate round-off is maintained.

By comparison, if the digits resulting from the first counting operation are "1 2 5 4 5", the third register will again be set to "5" and "1 2" will be displayed during the first cycle. If the counting operation again remains constant, the digits in the counter will be "1 3 1 4 5" due to carry-in and carry-out of the counter. The displayed digits will be "1 3", which again is appropriately rounded.

Greater detail regarding one embodiment of the frequency counter is provided in FIG. 5. As shown therein, the selected output of counting means 106 is transmitted to latch 120 and a driver 126 and, thereafter, to display means 124. An enabling circuit 128 of the type known to those of skill in the art, is used to control the output of driver 126 to the display 124.

It is to be understood that the above description is intended to be illustrative and not restrictive. Many embodiments will be apparent to those of skill in the art upon reviewing the above description. The scope of the invention should, therefore, be determined not with reference to the above description, but should instead be determined with reference to the appended claims, along with the full scope of equivalents to which such claims are entitled.

What is claimed is:

1. Frequency detecting apparatus comprising:
   (a) means for providing a time base;
   (b) means for dividing said time base into a plurality of discrete time bases;
   (c) means for counting a number of clock pulses during said discrete time bases;
   (d) means for indicating a frequency of said clock pulses based on said number of clock pulses; and
   (e) round off means assigning a value of 5 to a most significant digit of said frequency which is not to be displayed and a value of 0 to all other digits.

2. Apparatus as recited in claim 1 further comprising a central processing unit utilizing said clock pulses.

3. Apparatus as recited in claim 1, wherein said means for counting further comprises an AND gate, said AND gate having said clock pulses and said plurality of discrete time bases as inputs.

4. A method for measuring a frequency of clock pulses comprising:
   (a) providing a time base;
   (b) dividing said time base into a plurality of discrete time bases, said discrete time bases sampling said clock pulses over a wider range of time than said time base;
   (c) counting a number of clock pulses during said discrete time bases; and
   (d) displaying a frequency of said clock signal, said frequency based on said number of pulses.

5. The method as recited in claim 4, wherein the step of counting further comprises the steps of applying said clock pulses and said time bases to an AND gate and counting a number of pulses from said AND gate.

6. The method as recited in claim 4 further comprising the step of rounding-off said frequency, said step of rounding-off further comprising the steps of:
   (a) setting a most significant digit which is not to be displayed to a value of "5";
   (b) setting all other digits in said frequency to "0"; and
   (c) determining a frequency during a second set of discrete time bases.

7. A frequency detector for detecting a frequency of clock pulses fed to CPU in a computer system, comprising:
   (a) time base circuit means for generating a time base;
   (b) time base dividing circuit means for dividing said time base into a plurality of discrete sub-time bases;
   (c) AND gating means for ANDing said sub-time bases and a series of clock pulses to be detected;
   (d) counter means for counting clock pulses from output of said AND gating means;
   (e) latch means for latching output from said counter means;
   (f) decoder means for decoding output from said latch means;
   (g) driver means for buffering output from said decoder means;
   (h) display means for displaying output from said driver means;
   (i) connection means wherein said time base dividing circuit means dividing a time base from said time base circuit means into a plurality of discrete sub-time bases are thereafter fed to said AND gating means along with a series of clock pulses to be detected, the output of said AND gating means being then fed to said counter means whereby the counted value in the counter means represents an average frequency over a substantially wider range of clock pulses;

(j) a selector between said counter means and latch means for selecting a desired number of digits from said counter means; and (k) control circuit means for performing a round-off and selecting displayed digits in the counter means in cooperation with said selector, said means for performing a round-off assigning a "5" to a next most significant digit other than a desired number of digits to be displayed in said counter means, and an "0" to all other digits.

8. A method for measuring a frequency of clock pulses comprising:
   (a) providing a time base;
   (b) dividing said time base into a plurality of discrete time bases;
   (c) counting a number of clock pulses during said discrete time bases;
   (d) rounding-off said frequency, said step of rounding-off further comprising the steps of:
      (i) setting a most significant digit which is not to be displayed to a value of "5";
      (ii) setting all other digits in said frequency to "0"; and
      (iii) determining a frequency during a second set of discrete time bases; and
   (e) displaying a frequency of said clock signal.

* * * * *